(12) United States Patent
Hong et al.

(10) Patent No.: US 11,071,241 B2
(45) Date of Patent: Jul. 20, 2021

(54) ELECTROMAGNETIC SHIELDING METHOD USING GRAPHENE AND ELECTROMAGNETIC SHIELDING MATERIAL

(71) Applicant: Graphene Square Inc., Seoul (KR)

(72) Inventors: Byung Hee Hong, Suwon-si (KR); Jea-Boong Choi, Yongin-si (KR); Young Jin Kim, Seoul (KR); Hyeongkeun Kim, Hwaseong-si (KR); Sukang Bae, Suwon-si (KR); Junmo Kang, Bucheon-si (KR)

(73) Assignee: Graphene Square Inc., Seoul (KR)

( * ) Notice: Subject to any disclaimer, the term of this patent is extended or adjusted under 35 U.S.C. 154(b) by 67 days.

(21) Appl. No.: 16/025,118

(22) Filed: Jul. 2, 2018

(65) Prior Publication Data

US 2018/0310443 A1     Oct. 25, 2018

Related U.S. Application Data

(63) Continuation-in-part of application No. 13/582,944, filed as application No. PCT/KR2011/001491 on Mar. 4, 2011, now abandoned.

(30) Foreign Application Priority Data

Mar. 5, 2010 (KR) .................. 10-2010-0020069

(51) Int. Cl.
| | |
|---|---|
| *H05K 9/00* | (2006.01) |
| *C23C 16/26* | (2006.01) |
| *C23C 16/01* | (2006.01) |
| *C23C 16/54* | (2006.01) |
| *C23C 16/56* | (2006.01) |
| *B32B 37/16* | (2006.01) |
| *B82Y 30/00* | (2011.01) |
| *B32B 37/00* | (2006.01) |

(52) U.S. Cl.
CPC ........... *H05K 9/0084* (2013.01); *C23C 16/01* (2013.01); *C23C 16/26* (2013.01); *C23C 16/545* (2013.01); *C23C 16/56* (2013.01); *H05K 9/0088* (2013.01); *B32B 37/025* (2013.01); *B32B 37/16* (2013.01); *B32B 2313/04* (2013.01); *B82Y 30/00* (2013.01)

(58) Field of Classification Search
CPC .................................................. H05K 9/0084
See application file for complete search history.

(56) References Cited

U.S. PATENT DOCUMENTS

| | | |
|---|---|---|
| 6,436,541 B1 | 8/2002 | Sopko et al. |
| 2002/0166658 A1 | 11/2002 | Norley et al. |
| 2004/0116013 A1* | 6/2004 | Yoshida ............ B32B 3/10 |
| | | 442/43 |
| 2006/0126304 A1 | 6/2006 | Smalc et al. |
| 2009/0117386 A1 | 5/2009 | Vacanti et al. |
| 2009/0135042 A1 | 5/2009 | Umishita et al. |
| 2009/0303602 A1 | 12/2009 | Bright et al. |
| 2009/0308520 A1 | 12/2009 | Shin et al. |
| 2010/0055025 A1 | 3/2010 | Jang et al. |
| 2011/0030991 A1* | 2/2011 | Veerasamy ......... C30B 29/02 |
| | | 174/126.1 |
| 2011/0100951 A1 | 5/2011 | Juang et al. |
| 2012/0127578 A1* | 5/2012 | Bright ............... G02B 5/207 |
| | | 359/585 |

FOREIGN PATENT DOCUMENTS

KR    1020100004399 A    1/2010

OTHER PUBLICATIONS

Sukang Bae, et al., 30-Inch Roll-Based Production of High-Quality Graphene Films for Flexible Transport Electrodes, Materials Science, arXiv:0912.5485v1, Dec. 30, 2009.
ARXIV, To Submit a Paper, <https://arxiv.org/help/submit>, Oct. 16, 2009.
International Search report for PCT/KR2011/001491, dated Nov. 18, 2011.

* cited by examiner

*Primary Examiner* — Austin Murata
(74) *Attorney, Agent, or Firm* — Greer, Burns & Crain, Ltd.

(57) ABSTRACT

A method for shielding electromagnetic waves by using grapheme formed on inside or outside a device having an electromagnetic wave generating source and/or by using graphene formed on a substrate, an electromagnetic shielding material and film including the graphene, and an electronic or electric device including the electromagnetic wave shielding film.

17 Claims, 11 Drawing Sheets

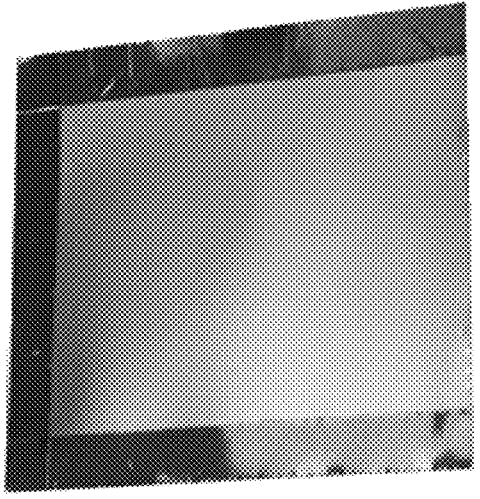
FIG. 8C  FIG. 8B  FIG. 8A
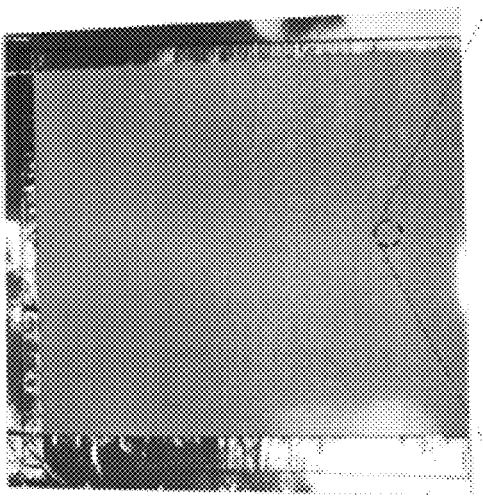
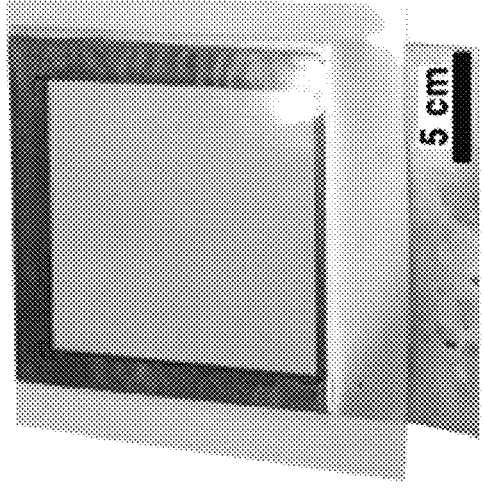
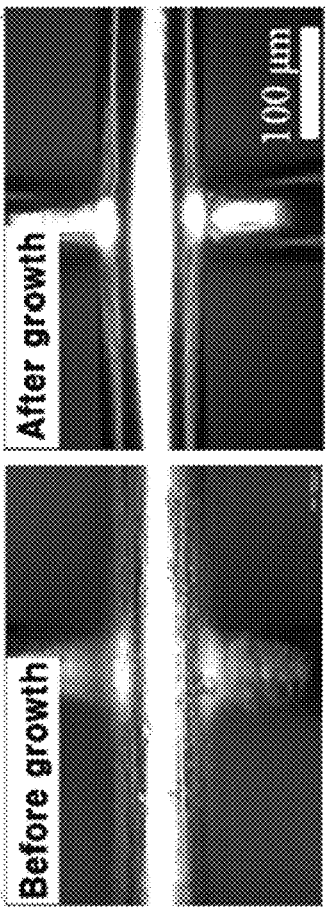
FIG. 8D

ELECTROMAGNETIC SHIELDING METHOD USING GRAPHENE AND ELECTROMAGNETIC SHIELDING MATERIAL

CROSS-REFERENCE TO RELATED APPLICATION

This application is a continuation-in-part of U.S. application Ser. No. 13/582,944 filed on Sep. 5, 2012, which is a national phase of application No. PCT/KR2011/001491 filed on Mar. 4, 2011, which claims priority to Korean Patent Application No. 10-2010-0020069 filed on Mar. 5, 2010 before the Korean Intellectual Property Office, the entire contents of all of which are hereby incorporated by reference.

TECHNICAL FIELD

The present disclosure relates to a method for shielding electromagnetic waves by using graphene, an electromagnetic wave shielding material using graphene, an electromagnetic wave shielding film including the graphene, and an electronic or electric device including the electromagnetic wave shielding material or film.

BACKGROUND ART

Electromagnetic waves are electromagnetic energy generated from use of electricity and have broad frequency domains. Depending upon frequencies, electromagnetic waves are classified into home power frequency (60 Hz), extremely low frequency (0 Hz to 1000 Hz), low frequency (1 kHz to 500 kHz), communication frequency (500 kHz to 300 kHz), and microwave (300 MHz to 300 GHz: G-1 billion). Frequencies become high in order of an infrared ray, a visible ray, an ultraviolet ray, an X-ray, and a gamma ray.

In recent, the rapid propagation of digital devices such as PCs and mobile phones has caused a flood of electromagnetic waves even at workplaces or homes. Damages by electromagnetic waves have occurred in various forms from malfunction of a computer and a burning accidence in a plant to an adverse effect on a human body. Thus, the technology of shielding electromagnetic waves in various electric and electronic products is arising as a core technical field of the electronics industry.

The technology of shielding electromagnetic waves may be divided into a method that protects external equipment by shielding the periphery of an electromagnetic wave generating source, and a method that stores equipment in the inside of a shielding material to protect the equipment from an external electromagnetic wave generating source. In this regard, recently, researches on shielding materials for shielding electromagnetic waves have been spotlighted. However, there are still many problems with regard to performance, applicability, costs, and others of the shielding materials.

DISCLOSURE OF THE INVENTION

Problems to be Solved by the Invention

The inventors of the present application wish to provide a method for shielding electromagnetic waves by using one or more layers of graphene that can be prepared in a large scale with high uniformity and high quality, an electromagnetic wave shielding material including the graphene, an electromagnetic wave shielding film including the graphene, and an electronic or electric device including the electromagnetic wave shielding material or film.

However, the problems sought to be solved by the present disclosure are not limited to the above-described problems. Other problems, which are sought to be solved by the present disclosure but are not described herein, can be clearly understood by those skilled in the art from the descriptions below.

Means for Solving the Problems

In order to solve the above-described problems, a method for shielding electromagnetic waves by using graphene in accordance with one aspect of the present disclosure includes forming one or more layers of graphene outside or inside a device having electromagnetic wave generating source to shield electromagnetic waves by the graphene. For the device having the electromagnetic wave generating source, any devices, articles or products that generate electromagnetic waves can be used without limitation. For example, the devices having the electromagnetic wave generating source may include various electronic/electric devices and components such as TV, radio, computer, medical appliances, home appliances such as a microwave oven, office machines, a communication device such as cell phone, but not limited thereto.

In one embodiment of the present disclosure, the one or more layers of graphene may be formed on at least one outside surface of the various electronic/electric devices and components, or may be formed on at least one inside surface of the various electronic/electric devices and components. The electronic/electric devices and components may generate or have at least one electromagnetic wave generating sources. For one example, the one or more layers of graphene may be formed on at least one outside surface of a door and/or another parts(s) of a microwave oven, or on at least one inside surface of a door and/or another inside part(s) of a microwave oven, but not limited thereto. For another example, the one or more layers of graphene may be formed on at least one outside surface of a cell phone, or on at least one inside surface of a cell phone, but not limited thereto.

In another embodiment of the present disclosure, the one or more layers of graphene may be formed on at least surface of the electromagnetic wave generating source in the device to shield electromagnetic waves by the graphene, but not limited thereto.

In another embodiment of the present disclosure, the graphene may be formed outside or inside the devices having the electromagnetic wave generating source by a chemical vapor deposition method or a method known in the art, but not limited thereto.

In another embodiment of the present disclosure, the graphene may be formed by transferring or laminating the graphene formed on a substrate by the chemical vapor deposition method or a method known in the art to the outside or the inside of the devices having the electromagnetic wave generating source, but not limited thereto.

In another embodiment of the present disclosure, the substrate may be a rigid and/or transparent substrate, a flexible and/or transparent substrate, or a stretchable and/or transparent substrate, but not limited thereto. For one example, the substrate may include a metal, glass, quartz, semiconductor, or polymer, but not limited thereto. For another example, the substrate may include a flexible and/or transparent polymer, or a stretchable and/or transparent polymer, but not limited thereto.

In another embodiment of the present disclosure, the graphene may be doped, but is not limited thereto. For example, the graphene may be chemically doped or doped by any methods including doping methods in the art.

In another embodiment of the present disclosure, sheet resistance of the graphene may be about 1,000 Ω/sq or less. For example, the sheet resistance of the graphene may be, but not limited to, about 1,000 Ω/sq or less, about 900 Ω/sq or less, about 800 Ω/sq or less, about 700 Ω/sq or less, about 600 Ω/sq or less, about 500 Ω/sq or less, about 400 Ω/sq or less, about 300 Ω/sq or less, about 200 Ω/sq or less, about 150 Ω/sq or less, about 100 Ω/sq or less, about 70 Ω/sq or less, about 60 Ω/sq or less, about 50 Ω/sq or less, from about 150 Ω/sq to about 30 Ω/sq, from about 120 Ω/sq to about 30 Ω/sq, from about 100 Ω/sq to about 30 Ω/sq, from about 80 Ω/sq to about 30 Ω/sq, or from about 60 Ω/sq to about 30 Ω/sq, but is not limited thereto.

In another embodiment of the present disclosure, the substrate may be in a form of a foil, a wire, a plate, a tube, a film, a sheet, a mesh or a net. However, the present disclosure is not limited thereto.

Another aspect of the present disclosure provides a method for shielding electromagnetic waves by using graphene, which includes attaching, laminating or wrapping with a substrate on which graphene is formed or transferred to or around outside or inside of a device having an electromagnetic wave generating source to shield electromagnetic waves by the graphene.

For the device having the electromagnetic wave generating source, any devices, articles or products that generate electromagnetic waves can be used without limitation. For example, the devices having the electromagnetic wave generating source may include various electronic/electric devices and components such as TV, radio, computer, medical appliances, home appliances such as a microwave oven, office machines, a communication device such as cell phone, but not limited thereto. The electronic/electric devices and components may generate or have the electromagnetic wave generating source. For one example, the one or more layers of graphene may be attached to, laminated to or wrap at least one outside surface of the various devices, or at least one inside surface of the various devices, but not limited thereto. For another example, the one or more layers of graphene may be attached to, laminated to or wrap at least one outside surface of a door and/or another parts(s) of a microwave oven, or at least one inside surface of a door and/or another inside part(s) of a microwave oven, but not limited thereto. For another example, the one or more layers of graphene may be attached to, laminated to or wrap at least one outside surface of a cell phone, or at least one inside surface of a cell phone, but not limited thereto.

In one embodiment of the present disclosure, the graphene may be formed, but not limited to, on the substrate by a chemical vapor deposition method or a method known in the art.

In another embodiment of the present disclosure, the graphene may include, but not limited to, one or more layers of graphene.

In another embodiment of the present disclosure, the substrate may be a rigid and/or transparent substrate, a flexible and/or transparent substrate, or a stretchable and/or transparent substrate, but not limited thereto. For one example, the substrate may include a metal, glass, quartz, semiconductor, or polymer, but not limited thereto. For another example, the substrate may include a flexible and/or transparent polymer, or a stretchable and/or transparent polymer, but not limited thereto.

In another embodiment of the present disclosure, the graphene may be doped, but is not limited thereto. For example, the graphene may be chemically doped or doped by any methods including doping methods in the art.

In another embodiment of the present disclosure, sheet resistance of the graphene may be, but not limited to, about 1,000 Ω/sq or less.

In another embodiment of the present disclosure, the substrate may be in a form of a foil, a wire, a plate, a tube, a film, a sheet, a mesh or a net. However, the present disclosure is not limited thereto.

Another aspect of the present disclosure provides an electromagnetic wave shielding material including one or more layers of graphene formed on a substrate.

In one embodiment of the present disclosure, the graphene is formed by a chemical vapor deposition method or a method in the art.

In another embodiment of the present disclosure, the graphene has sheet resistance of about 1,000 Ω/sq or less.

In another embodiment of the present disclosure, the electromagnetic wave shielding material may include the one or more layers of graphene laminated on the substrate, but not limited to.

In another embodiment of the present disclosure, the graphene may include, but not limited to, monolayer graphene, or one or more layers of the graphene.

In another embodiment of the present disclosure, the graphene may be doped, but not limited to. For example, the graphene may be chemically doped or doped by any methods including doping methods in the art.

In another embodiment of the present disclosure, the substrate may be, but not limited to, in the form of a foil, a wire, a plate, a tube, a film, a sheet, a mesh or a net.

In another embodiment of the present disclosure, the substrate may be rigid and/or transparent substrate, a flexible and/or transparent substrate, or a stretchable and/or transparent substrate, but not limited thereto. For one example, the substrate may include a metal, glass, quartz, semiconductor, or polymer, but not limited thereto. For another example, the substrate may include a rigid and/or transparent polymer, or a flexible and/or transparent polymer, or a stretchable and/or transparent polymer, but not limited thereto.

Another aspect of the present disclosure provides an electromagnetic wave shielding film including one or more layers of graphene formed on one side of a substrate; an adhesive layer formed on the graphene; and a first protective layer formed on the adhesive layer.

In one embodiment of the present disclosure, the electromagnetic wave shielding film further includes a second protective layer formed or laminated on the other side of the substrate. However, the present disclosure is not limited thereto.

In another embodiment of the present disclosure, the electromagnetic wave shielding film may including the one or more layers of graphene laminated on one side of the substrate.

In another embodiment of the present disclosure, the substrate includes a flexible and/or transparent polymer, or a stretchable and/or transparent polymer, but not limited to.

In another embodiment of the present disclosure, the electromagnetic wave shielding film is in a form of sheet or roll, but not limited to.

In another embodiment of the present disclosure, the graphene may be doped, but not limited to. For example, the graphene may be chemically doped or doped by any methods including doping methods in the art.

Another aspect of the present disclosure provides an electronic or electric device including the magnetic wave shielding film of the above aspect of the present disclosure.

In one embodiment of the present disclosure, the electronic or electric device includes a microwave oven or mobile phone, but not limited to.

Another aspect of the present disclosure provides a microwave oven, comprising a window including one or more layers of graphene formed between two layers of a transparent substrate.

Effect of the Invention

The present disclosure can effectively shield electromagnetic waves generated from various electromagnetic wave generating sources by using graphene film uniformly prepared in a large scale. More specifically, the present disclosure can shield electromagnetic waves in a broad frequency band of from about 2 GHz to about 18 GHz by using graphene film, and furthermore, various substrates coated or laminated with graphene film. Further, the present disclosure can improve electromagnetic wave shielding efficiency by chemical, physical, and structural improvement of graphene such that the graphene can be used as an electromagnetic wave shielding material or film for various electronic or electric devices.

BRIEF DESCRIPTION OF THE DRAWINGS

FIG. 2A is a graph showing sheet resistance and an electric characteristic of graphene doped with $AuCl_3$—$CH_3NO_2$ in accordance with an example of the present disclosure, and FIG. 2B is a graph showing sheet resistance and an electric characteristic of graphene doped with HNO3 in accordance with an example of the present disclosure;

FIGS. 8A-8D are photographs obtained from observation of graphene formed on various substrates in an example of the present disclosure. FIG. 8A is a photograph obtained from observation of four layers of graphene, FIG. 8B is a photograph obtained from observation of graphene formed on Cu mesh, FIG. 8C is a photograph obtained from observation of graphene formed on Cu foil, and FIG. 8D are photographs which are enlarged views of specific areas of FIG. 8B before and after the graphene growth.

BEST MODE FOR CARRYING OUT THE INVENTION

Figure 1:
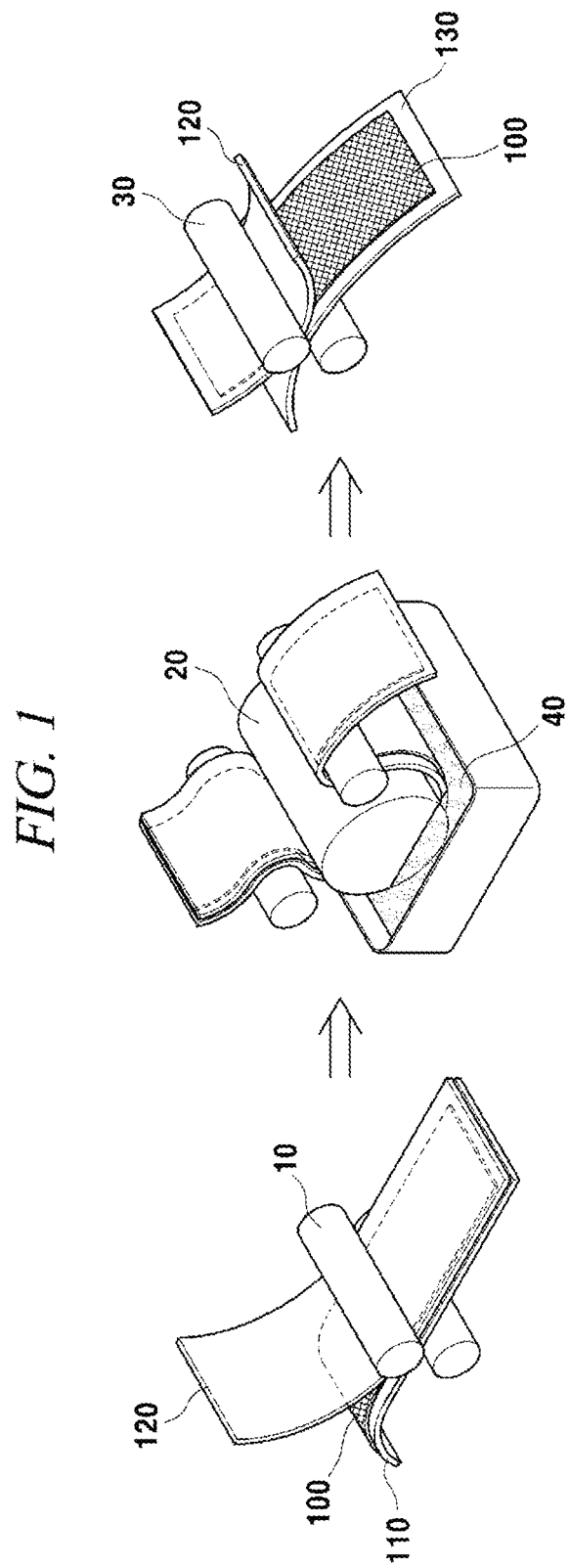
FIG. 1 is a block diagram showing a process for forming graphene on a substrate and its associated apparatus in accordance with an embodiment of the present disclosure.

Hereinafter, illustrative embodiments and examples of the present disclosure will be described in detail with reference to the accompanying drawings so that inventive concept may be readily implemented by those skilled in the art.

However, it is to be noted that the present disclosure is not limited to the illustrative embodiments and the examples but can be realized in various other ways. In the drawings, certain parts not directly relevant to the description are omitted to enhance the clarity of the drawings, and like reference numerals denote like parts throughout the whole document.

Throughout the whole document, the term "comprises or includes" and/or "comprising or including" used in the document means that one or more other components, steps, operations, and/or the existence or addition of elements are not excluded in addition to the described components, steps, operations and/or elements.

The terms "about or approximately" or "substantially" are intended to have meanings close to numerical values or ranges specified with an allowable error and intended to prevent accurate or absolute numerical values disclosed for understanding of the present invention from being illegally or unfairly used by any unconscionable third party.

Electromagnetic wave shielding means shielding electromagnetic interference (EMI) incident from the outside, and absorbs/reflects electromagnetic waves on a surface so as to prevent the electromagnetic waves from being transferred or laminated into the inside. The present disclosure effectively shields electromagnetic waves by using large scale graphene, rather than metal or conductive organic polymer which has been conventionally used as an electromagnetic wave shielding material.

A method for shielding electromagnetic waves by using graphene in accordance with one aspect of the present disclosure includes forming one or more layers of graphene outside or inside a device having electromagnetic wave generating source to shield electromagnetic waves by the graphene.

In order to form graphene outside or inside the device having the electromagnetic wave generating source, various methods may be used. As various embodiments of the method for shielding electromagnetic waves in accordance with the present disclosure, electromagnetic waves may be shielded by forming or laminating the graphene directly outside or inside the device having the electromagnetic wave generating source, transferring or laminating graphene formed on a substrate to the outside or the inside of the device having the electromagnetic wave generating source, or forming the substrate itself, on which the graphene is formed, outside or inside the device having the electromagnetic wave generating source. For example, the graphene is formed by transferring or laminating the graphene formed on a substrate by a chemical vapor deposition method or laminating the graphene formed by a chemical vapor deposition method to the outside or the inside of the device having the electromagnetic wave generating source, but not limited thereto.

As the method for forming graphene, which is used as an electromagnetic wave shielding material, any method can be used without limitation if the method is generally used in the art of the present disclosure to grow graphene. For example, a chemical vapor deposition method may be used, but not limited to. The chemical vapor deposition method may include, but not limited to, rapid thermal chemical vapour deposition (RTCVD), inductively coupled plasma-chemical vapor deposition (ICP-CVD), low pressure chemical vapor deposition (LPCVD), atmospheric pressure chemical vapor deposition (APCVD), metal organic chemical vapor deposition (MOCVD), and plasma-enhanced chemical vapor deposition (PECVD).

The process for growing graphene may be performed under an atmospheric pressure, a low pressure, or vacuum. For example, if the process is performed under the condition of an atmospheric pressure, helium (He) or the like may be used as a carrier gas to minimize damage to the graphene caused by collision with heavy argon (Ar) at a high temperature. Also, if the process is performed under the condition of an atmospheric pressure, a large-scale graphene film can be produced by a simple process at low costs. If the process is performed under the condition of a low pressure or vacuum, hydrogen ($H_2$) may be used as an atmosphere gas, while increasing a temperature during the process, so that an oxidized surface of a metal catalyst is reduced, and high-quality graphene can be synthesized.

The graphene formed by the above-described method may have a large scale with a horizontal and/or vertical length of from about 1 mm to about 1,000 m. The graphene may have a homogeneous, uniform structure with little deficits. The graphene formed by the above-described method may include monolayer or multilayer graphene. An electric characteristic of the graphene may vary depending on the thickness of the graphene. Accordingly, the electromagnetic wave shielding effect may vary. As an unlimited example, the thickness of the graphene may be adjusted in a range of from 1 layer to 100 layers. For example, the thickness of the graphene may be adjusted in a range of from 1 layer to 100 layers, from 1 layer to 90 layers, from 1 layer to 80 layers, from 1 layer to 70 layers, from 1 layer to 60 layers, from 1 layer to 50 layers, from 1 layer to 40 layers, from 1 layer to 30 layers, from 1 layer to 20 layers, from 1 layer to 10 layers, from 1 layer to 8 layers, from 1 layer to 6 layers, from 1 layer to 4 layers, or from 1 layer to 2 layers.

The graphene may be formed on a substrate. In this case, as described above, electromagnetic waves may be shielded by transferring or laminating the one or more layers of graphene formed on the substrate to the outside or the inside of the device having the electromagnetic wave generating source, or attaching or wrapping with the substrate itself, on which the graphene is formed, to or around the outside or the inside of the device having the electromagnetic wave generating source. A shape of the substrate is not limited. For example, the substrate may be in the form of a foil, a wire, a plate, a tube, a film, a sheet, a mesh, or a net. The electromagnetic shielding effect may vary depending on the shape of the substrate.

For the device having the electromagnetic wave generating source, any devices, articles or products that generate electromagnetic waves can be used without limitation. For example, the devices having the electromagnetic wave generating source may include various electronic/electric devices and components such as TV, radio, computer, medical appliances, home appliances such as a microwave oven, office machines, a communication device such as cell phone, but not limited thereto. The electronic/electric devices and components may generate or have the electromagnetic wave generating source. For one example, the one or more layers of graphene may be attached to, laminated to or wrap at least one outside surface of the electronic/electric devices and components, or at least one inside surface of the electronic/electric devices and components, but not limited thereto. For another example, the one or more layers of graphene may be attached to, laminated to or wrap at least one outside surface of a door and/or another parts(s) of a microwave oven, or at least one inside surface of a door and/or another inside part(s) of a microwave oven, but not limited thereto. For another example, the one or more layers of graphene may be attached to, laminated to or wrap at least one outside surface of a cell phone, or at least one inside surface of a cell phone, but not limited thereto.

Materials for the substrate are not specially limited. For example, materials for the substrate may include at least one metal or alloy selected from the group consisting of silicone, Ni, Co, Fe, Pt, Au, Al, Cr, Cu, Mg, Mn, Mo, Rh, Si, Ta, Ti, W, U, V, Zr, brass, bronze, white brass, stainless steel, Ge, and polymer. If the substrate is formed of metal, the metal substrate may function as a catalyst for the formation of the graphene.

However, the substrate does not need to be formed of a metal. For example, silicon may be used for the substrate. For formation of a catalyst layer on the silicon substrate, a substrate, on which a silicon oxide layer is further formed by oxidization of the silicon substrate, may be used. The substrate may be a polymer substrate and include a polymer such as polyimides (PI), polyethersulfons (PES), polyeheretherketones (PEEK), polyethyleneterephthalates (PET), silicones, polyethylene naphthalates (PEN), polymethyl methacrylates (PMMA), or polycarbonates (PC). As a method for forming graphene on the polymer substrate, any of the aforementioned chemical vapor deposition methods can be used. More preferably, the plasma-enhanced chemical vapor deposition method may be used at a low temperature of from about 100° C. to about 600° C.

Here, in order to facilitate the growth of graphene on the substrate, a catalyst layer may be further formed. Any catalyst layer may be used, regardless of materials, thickness, and a shape thereof. For example, the catalyst layer may be at least one metal or alloy selected from the group consisting of Ni, Co, Fe, Pt, Au, Al, Cr, Cu, Mg, Mn, Mo, Rh, Si, Ta, Ti, W, U, V, Zr, brass, bronze, white brass, stainless steel, and Ge. The catalyst layer may be formed of the same or different material as or from the substrate. Thickness of the catalyst layer is not limited and may be a thin or thick film.

In an embodiment for forming graphene on the substrate, the graphene may be grown by winding a metal substrate of a thin film or foil form into a roll form, putting the metal substrate into a tube-shaped furnace, supplying a reaction gas containing a carbon source, and performing heat treatment at an atmospheric pressure. The heat processing is performed, for example, at a temperature of from about 300° C. to about 2,000° C., while vaporously supplying a carbon source such as carbon monoxide, carbon dioxide, methane, ethane, ethylene, ethanol, acetylene, propane, butane, butadiene, pentane, pentene, cyclopentadiene, hexane, cyclohexane, benzene, or toluene. As a result, carbon components existing in the carbon source are bonded to one another to form a hexagonal plate shape structure so that the graphene film is grown.

In an embodiment, the heat processing is performed at a temperature of from about 300° C. to about 2,000° C., from about 300° C. to about 1,500° C., from about 300° C. to about 1,000° C., from about 300° C. to about 800° C., or from about 300° C. to about 500° C., but not limited there to.

The graphene formed as described above may be transferred onto the substrate by various methods. For the transferring method, any transferring method can be used without limitation if the transferring method is generally used in the art of the present disclosure. For example, a dry process, a wet process, a spray process, or a roll-to-roll process may be used. More preferably, in order to transfer large scale graphene by a simple process at low costs, the roll-to-roll process may be used. However, the present disclosure is not limited thereto.

FIG. 1 is a block diagram showing a process for forming graphene on a substrate and an associated transferring apparatus in accordance with an embodiment of the present disclosure. The transferring process includes rolling a flexible substrate, on which graphene is formed, and a target substrate in contact with the graphene by using a transfer roller to transfer the graphene onto the target substrate. To be more specific, the transferring process may include three steps, which include: rolling graphene 100 formed on a graphene growth supporter 110 and a flexible substrate in contact with the graphene by using a first roller 10, which is an adhesion roller, to form a layered structure of graphene growth supporter-graphene-flexible substrate; immersing the layered structure into an etching solution 40 and passing the layered structure through the etching solution 40 by using a second roller 20 to etch the graphene growth supporter and transfer the graphene onto the flexible substrate 120; and rolling the flexible substrate, onto which the graphene is transferred, and a target substrate 130 in contact with the graphene by using a third roller 30, which is a transfer roller, to transfer the graphene onto the target substrate. Here, the graphene growth supporter 110 may include a metal catalyst for the graphene growth and an additional substrate, which is selectively formed on a bottom portion thereof. In an illustrative embodiment of the present disclosure, the metal catalyst for the graphene growth may include, but not limited to, a metal catalyst selected from the group consisting of Ni, Co, Fe, Pt, Au, Al, Cr, Cu, Mg, Mn, Rh, Si, Ta, Ti, W, U, V, and Zr.

An adhesive layer may be formed on the flexible substrate 120. For example, the adhesive layer may include, but not limited to, thermal release polymer, low density polyethylene, low molecular polymer, high molecular polymer, or ultraviolet or infrared ray curable polymer. Specifically, for the adhesive layer, PDMS, various types of poly urethane films, a water system adhesive, which is an environment-friendly adhesive, a water soluble adhesive, a vinyl acetate emulsion adhesive, a hot melt adhesive, a photo-curable (UV, visible light, electron beam, and UV/EB curable) adhesive, a NOA adhesive, and high heat resistance adhesives such as polybenizimidazole (PBI), polyimide (PI), silicone/imide, bismaleimide (BMI), and modified epoxy resin, and the like may be used. Various general adhesive tapes may also be used. As described above, large scale graphene may be transferred from the graphene growth supporter onto a flexible substrate through the roll-to-roll process. The process for transferring the graphene onto the target substrate may be more easily performed within short time at low costs. As the process for transferring the graphene onto the substrate, the roll-to-roll process has been described in detail. However, the present disclosure is not limited to the roll-to-roll process. The graphene may be transferred onto the substrate by various processes.

Once electromagnetic waves are incident onto a shielding material, the electromagnetic waves are absorbed, reflected, diffracted, or penetrate. In this case, the total sum of the shielding effects refers to shielding efficiency, which is represented by the following formula:

$$SE = SER + SEA + SEB \quad (1.1)$$

Here, SER indicates decrease (dB) by reflection. SEA indicates decrease (dB) by absorption, and SEB indicates decrease (dB) by interior reflection of the shielding material. In the formula 1.1, if SEA is more than 10 dB, the SEB may be disregarded. SER (decrease by reflection) and SEA (decrease by absorption) are represented by the following formulas 1.2 and 1.3, respectively:

$$SER = 50 + 10 \log(\rho F) - 1 \quad (1.2)$$

$$SEA = 1.7t(F/\rho)^{1/2} \quad (1.3)$$

Here, $\rho$ refers to volume resistivity (W×cm); F refers to frequency (MHz); and t refers to thickness (cm) of the shielding material.

With reference to the formulas 1.2 and 1.3, it can be understood that the shielding efficiency increases as the thickness of the shielding material is large, and the volume resistivity is small.

In general, levels of the shielding effect follow the reference described hereinafter. There is little shielding effect in a range of from about 0 dB to about 10 dB. At least a certain degree of the shielding effect is found in a range of from about 10 dB to about 30 dB. An average degree of the shielding effect may be expected in a range of from about 30 dB to about 60 dB. In a range of about 60 dB to about 90 dB, at least an average degree of the shielding effect is achieved. In a range of about 90 dB or more, almost all electromagnetic waves can be shielded. An electromagnetic wave shielding material using metal is generally known to have a shielding effect of about 60 dB or more.

The shielding method using graphene in the present disclosure may adopt various methods to improve the shielding efficiency. More specifically, the shielding efficiency can be improved through chemical, physical, and structural improvement. For example, in order to improve the electromagnetic wave shielding efficiency by improving sheet resistance of the graphene, a method of changing the number of stacked layers of the graphene or doping the graphene may be used. However, the present disclosure is not limited thereto. If graphene formed on a substrate is used as a shielding material, the electromagnetic wave shielding efficiency may be improved depending on a shape of the substrate.

In another embodiment of the present disclosure, sheet resistance of the graphene may be, but not limited to, about 1,000 Ω/sq or less. For example, the sheet resistance of the graphene may be, but not limited to, about 1,000 Ω/sq or less, about 900 Ω/sq or less, about 800 Ω/sq or less, about 700 Ω/sq or less, about 600 Ω/sq or less, about 500 Ω/sq or less, about 400 Ω/sq or less, about 300 Ω/sq or less, about 200 Ω/sq or less, about 150 Ω/sq or less, about 100 Ω/sq or less, about 70 Ω/sq or less, about 60 Ω/sq or less, about 50 Ω/sq or less, from about 150 Ω/sq to about 30 Ω/sq, from about 120 Ω/sq to about 30 Ω/sq, from about 100 Ω/sq to about 30 Ω/sq, from about 80 Ω/sq to about 30 Ω/sq, or from about 60 Ω/sq to about 30 Ω/sq, but is not limited thereto.

In another embodiment of the present disclosure, the sheet resistance of the graphene decreases as the number of layers of the graphene increases. For example, the sheet resistance of the graphene decreases from about 150 Ω/sq to about 30 Ω/sq as first to fourth layers are stacked in order, but the present disclosure is not limited thereto.

Figure 2A:
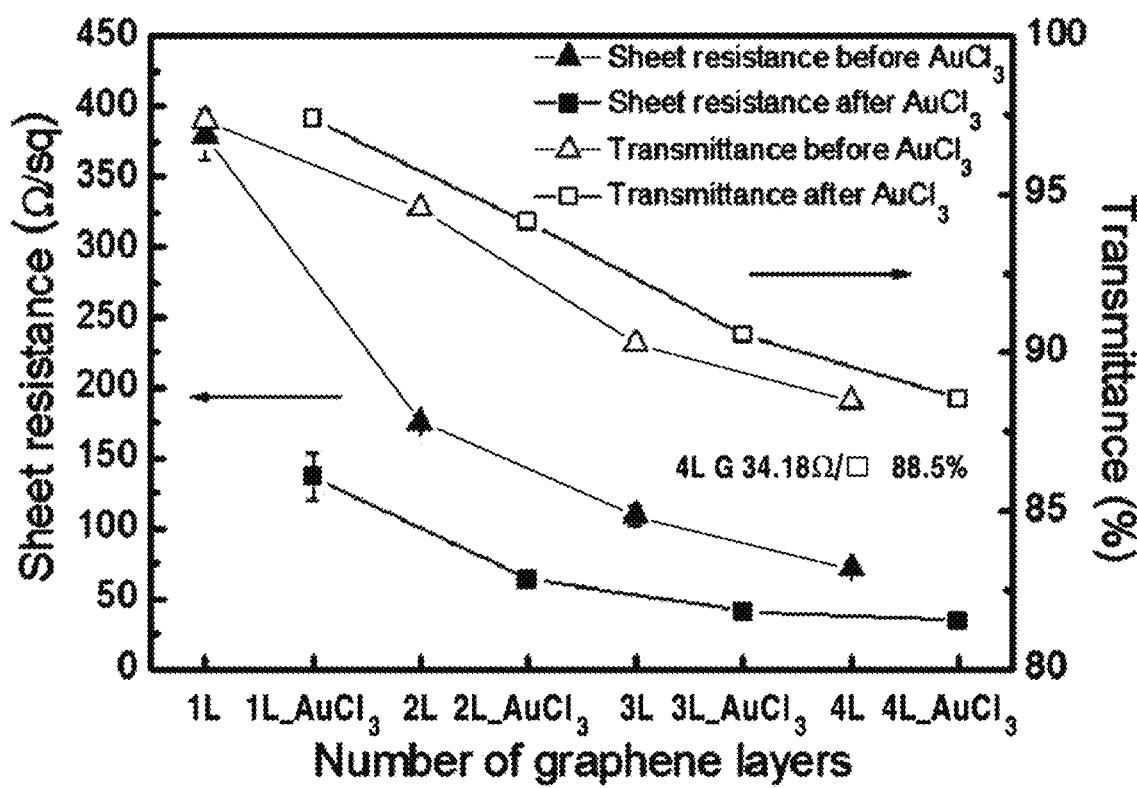
FIGS. 2A and 2B are graphs showing sheet resistance and an electric characteristic of graphene in accordance with an example of the present disclosure.

The electromagnetic wave shielding efficiency may be improved by changing the number of layers of the graphene. However, the present disclosure is not limited thereto. For example, multilayer graphene may be formed by repeating the aforementioned roll-to-roll transferring process. However, the present disclosure is not limited thereto. The multilayer graphene may remedy deficits of a monolayer graphene. More specifically, with reference to FIGS. 2A and 2B, it is understood that the sheet resistance of the graphene decreases as the number of layers of the graphene increases. With reference to FIG. 2A, in case of graphene doped with $AuCl_3$—$CH_3NO_2$ in accordance with an example of the present disclosure, the sheet resistance of the graphene decreases from about 140 Ω/sq to about 34 Ω/sq as first to fourth layers are stacked in order. Also, in case of graphene doped with $NHO_3$, the sheet resistance of the graphene decreases from about 235 Ω/sq to about 62 Ω/sq as first to fourth layers are stacked in order.

As another embodiment for improvement of the electromagnetic wave shielding efficiency, a method of doping the graphene by using a dopant may be used. However, the present disclosure is not limited thereto. For the method of doping the graphene, any doping method may be used without limitation if the method is generally used in the art of the present disclosure. As illustrated in FIG. 1, the graphene may be doped, but not limited to, by a roll-to-roll apparatus. If the graphene is doped by the roll-to-roll process, the whole processes for preparing, doping, and transferring the graphene can be performed by the simple and consecutive process, i.e., the roll-to-roll process.

The doping process may be performed by using a doping solution including dopant, or dopant steam. For example, in case of using the dopant steam, the dopant steam may be formed by a heating apparatus for vaporizing the doping solution in a vessel containing the doping solution.

The dopant may include, but not limited to, at least one selected from the group consisting of ionic liquid, ionic gas, an acidic compound, and an organic molecular system compound. The dopant may include, but not limited to, at least one selected from the group consisting of $NO_2BF_4$, $NOBF_4$, $NO_2SbF_6$, HCl, $H_2PO_4$, $H_3CCOOH$, $H_2SO_4$, $HNO_3$, PVDF, Nafion, $AuCl_3$, $SOCl_2$, $Br_2$, $CH_3NO_2$, dichlorodicyanoquinone, oxon, dimyristoylphosphatidylinositol, and trifluoromethanesulfonimide. An electric characteristic of the graphene such as the sheet resistance may be adjusted by changing dopant and/or doping time during the doping process.

Figure 2B:
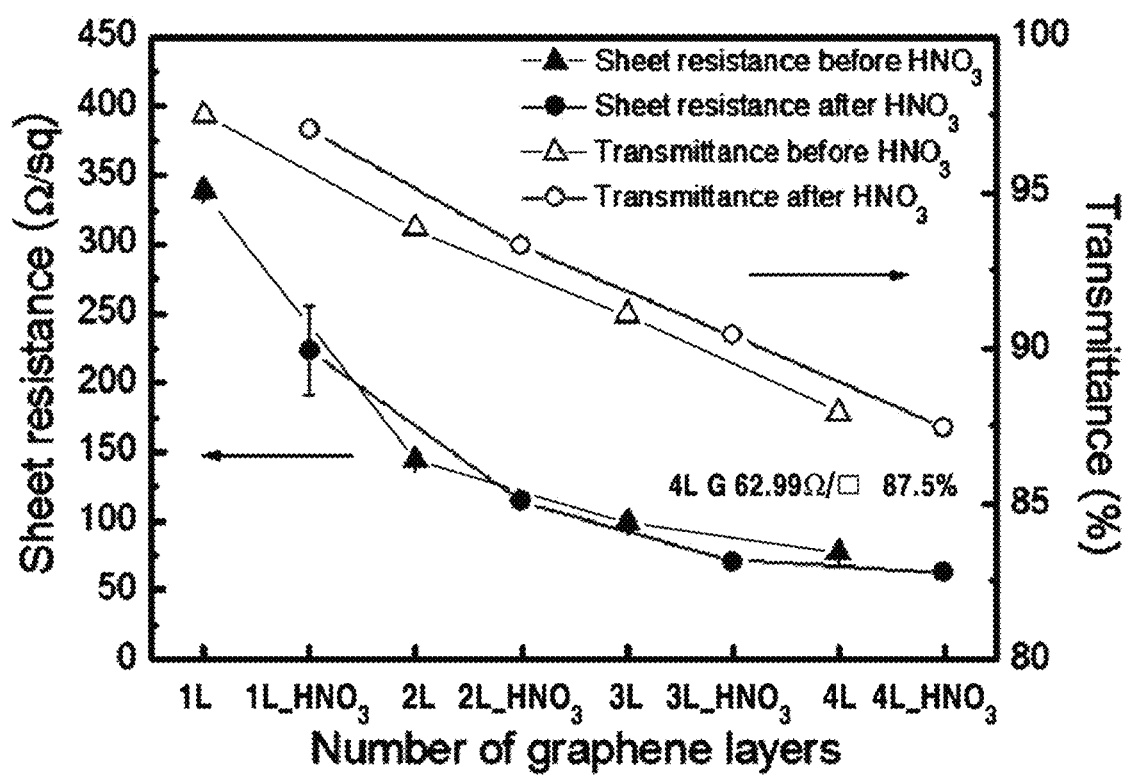
Figure 3:
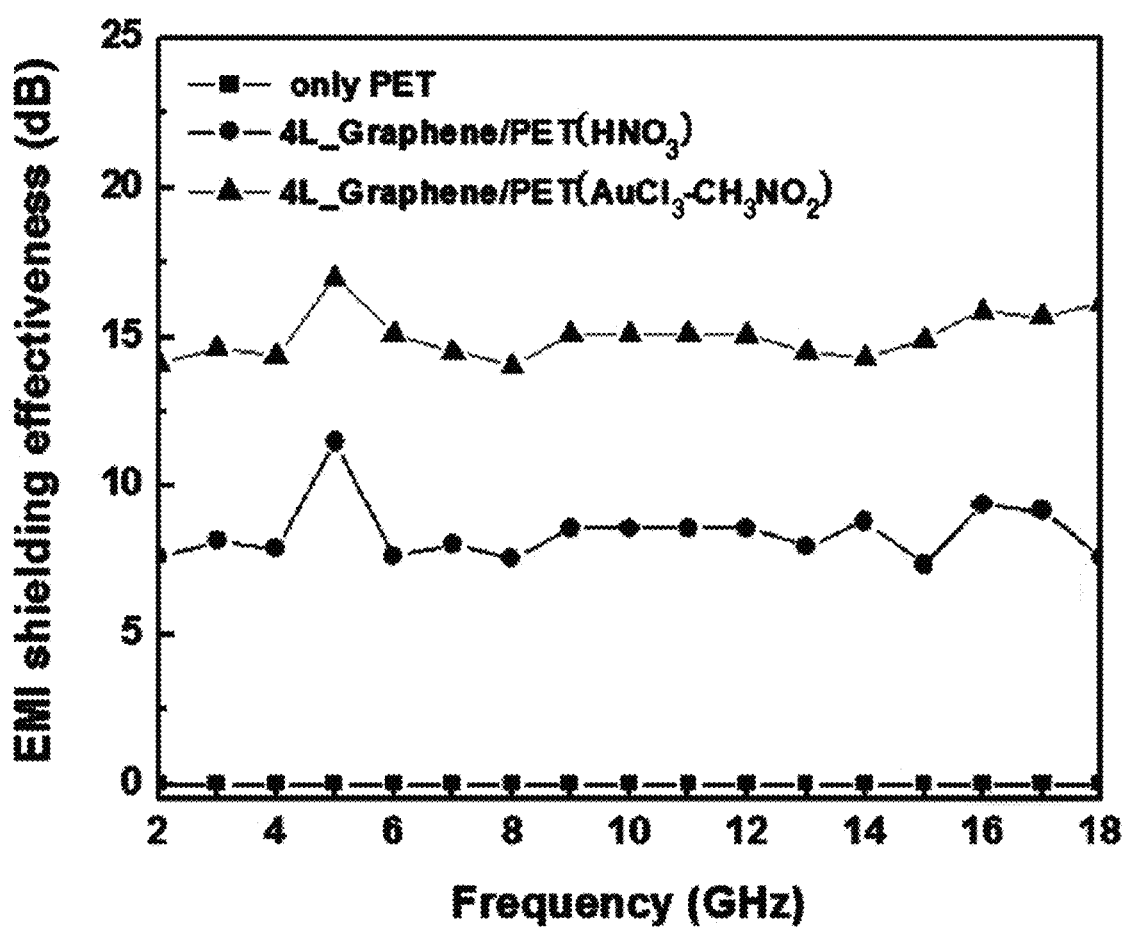
FIG. 3 is a graph obtained from measurement of an electromagnetic wave shielding effect of graphene doped by various dopants in an example of the present disclosure.

FIGS. 2A, 2B, and 3 provide results exhibiting the electric characteristic and the shielding efficiency of graphene depending on various dopants in accordance with an example of the present disclosure. More specifically, in an example of the present disclosure, with reference to FIGS. 2A and 2B, the resistance of the graphene doped with $AuCl_3$—$CH_3NO_2$ decreased, compared to pristine graphene.

FIG. 3 shows shielding testing results for shielding materials prepared by doping tetralayer graphene with different dopants in accordance with an example of the present disclosure. More specifically, in an example of the present disclosure, a PET substrate, tetralayer graphene doped with $HNO_3$ on the PET substrate, and tetralayer graphene doped with $AuCl_3$—$CH_3NO_2$ on the PET substrate were used as shielding materials. The shielding efficiency was measured by increasing the frequency domain from about 2 GHz to about 18 GHz. In an example of the present disclosure, the shielding efficiency of the $HNO_3$ doped graphene shielding material with the sheet resistance of about 62 Ω/sq (refer to FIG. 2B) was improved by about 7.6%, compared to the PET shielding material. In case of the graphene shielding material doped with $AuCl_3$—$CH_3NO_2$ (sheet resistance of about 32 Ω/sq; refer to FIG. 2A), about 15% of the shielding improvement effect was achieved. With reference to the results in FIGS. 2A, 2B and 3, in an example of the present disclosure, the sheet resistance decreasing rate and the shielding rate of the graphene are in a linear proportional relation depending on the doping method and the number of layers of graphene.

As another embodiment for improvement of the electromagnetic wave shielding efficiency, if graphene formed on a substrate is used as a shielding material, the shielding efficiency may vary depending on a shape of the substrate.

Figure 4:
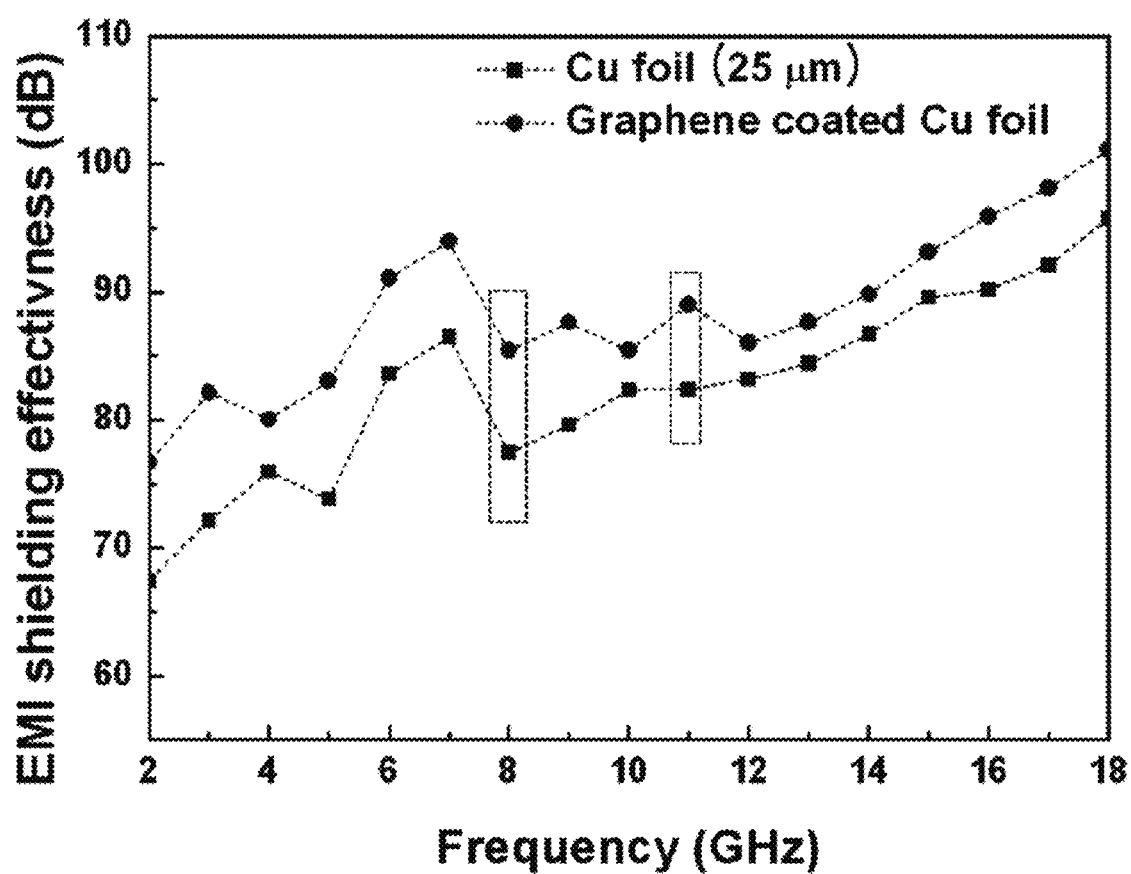
FIG. 4 is a graph obtained from measurement of an electromagnetic wave shielding effect of a Cu foil and graphene formed on a Cu foil in an example of the present disclosure.
Figure 5:
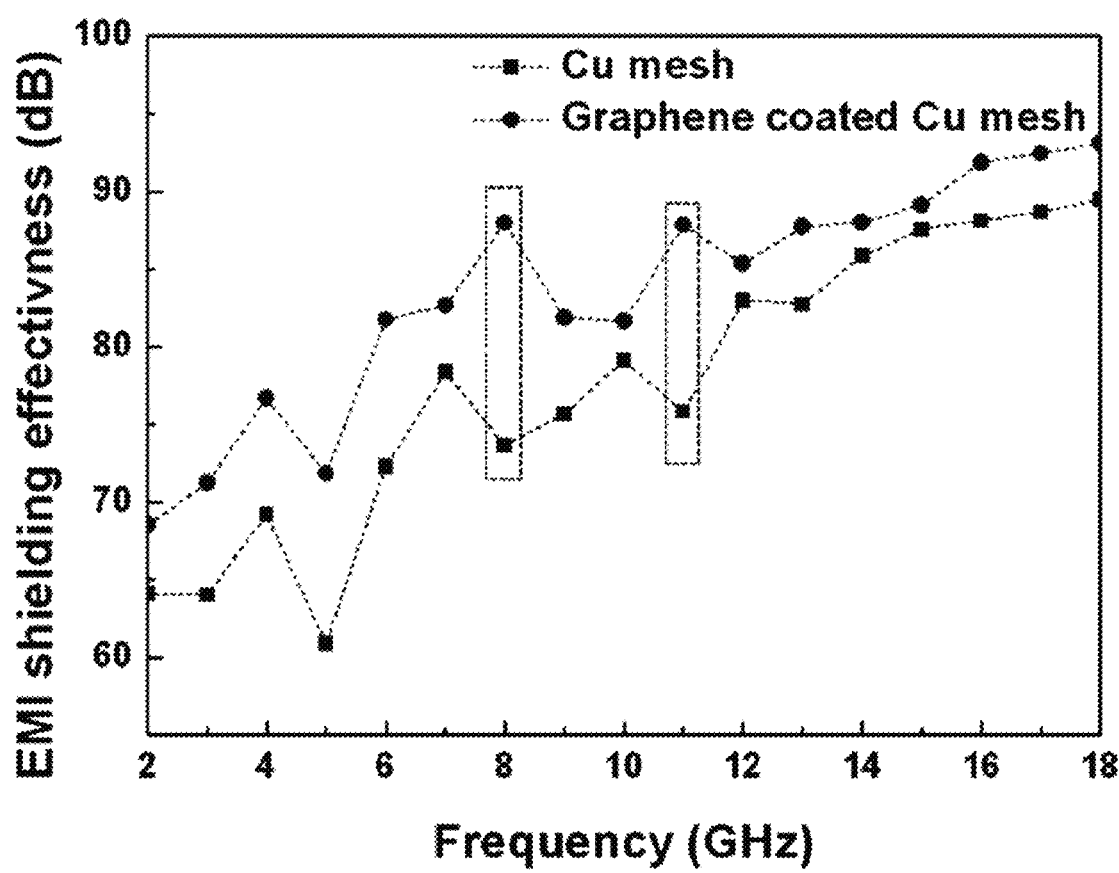
FIG. 5 is a graph obtained from measurement of an electromagnetic wave shielding effect of a Cu mesh and graphene formed on a Cu mesh in an example of the present disclosure.

FIGS. 4 and 5 provide analysis results for the shielding efficiency of the graphene depending on a shape of a substrate in an example of the present disclosure. More specifically, in FIG. 4, graphene formed on a Cu foil was used as a shielding material. In FIG. 5, graphene formed on a Cu mesh was used as a shielding material. The graphenes formed on the Cu foil and the Cu mesh are the same to each other. The shielding efficiency of the shielding materials was tested in the frequency domain of from about 2 GHz to about 18 GHz. With reference to FIG. 4, in an example of the present disclosure, the graphene shielding material formed on the Cu foil exhibited the biggest variation width at 8 GHz, compared to the shielding material only formed of the Cu foil. Based on the analysis results, the shielding efficiency was improved by about 10.62%. The shielding efficiency was improved by about 8.2% at 11 GHz in an example of the present disclosure. With reference to FIG. 5, in an example of the present disclosure, the graphene shielding material formed on the Cu mesh exhibited about 19% improvement of the shielding efficiency at 8 GHz, and about 17% improvement of the shielding efficiency at 11 GHz, compared to the shielding material only formed of the Cu mesh.

As described above, the method for shielding electromagnetic waves by using graphene in the present disclosure and the shielding material using the graphene are expected to be widely applied in various fields as novel materials capable of maximizing the electromagnetic wave shielding efficiency, in addition to effects such as device weight reduction, oxidization prevention, and surface roughness improvement.

Figure 10:
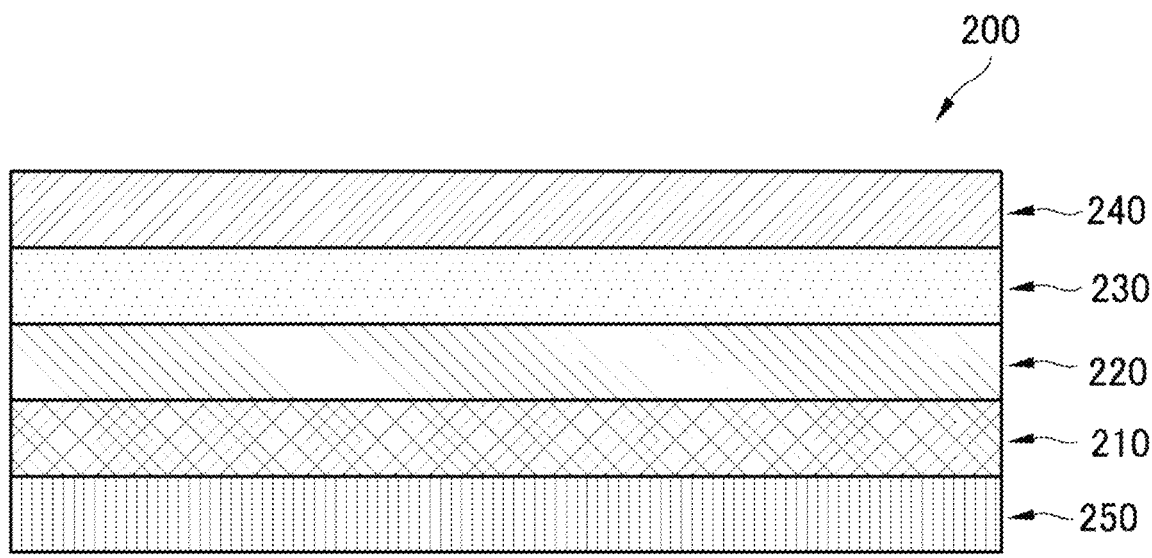
FIG. 10 is a schematic view of an electromagnetic wave shielding film in accordance with an embodiment of the present disclosure.

Another aspect of the present disclosure provides an electromagnetic wave shielding film (200) including one or more layers of graphene (220) formed on one side of a substrate (210); an adhesive layer (230) formed on the graphene; and a first protective layer (240) formed on the adhesive layer, as shown in FIG. 10.

In one embodiment of the present disclosure, the electromagnetic wave shielding film may optionally further include a second protective layer (250) formed on the other side of the substrate, as shown in FIG. 10. However, the present disclosure is not limited thereto.

In another embodiment of the present disclosure, the electromagnetic wave shielding film (200) may include the one or more layers of graphene (220) laminated on the one side of the substrate (210), but not limited thereto.

In another embodiment of the present disclosure, the graphene may be chemically doped. However, the present disclosure is not limited thereto.

In another embodiment of the present disclosure, the graphene may include, but not limited to, monolayer graphene, or one or more layers of the graphene. In one embodiment of the present disclosure, the sheet resistance of the graphene decreases as the number of layers of the graphene increases.

In another embodiment of the present disclosure, the graphene may be formed by a chemical vapor deposition method or a method in the art, as described herein above.

In another embodiment of the present disclosure, sheet resistance of the graphene may be, but not limited to, about 1,000 Ω/sq or less. For example, the sheet resistance of the graphene may be, but not limited to, about 1,000 Ω/sq or less, about 900 Ω/sq or less, about 800 Ω/sq or less, about 700 Ω/sq or less, about 600 Ω/sq or less, about 500 Ω/sq or less, about 400 Ω/sq or less, about 300 Ω/sq or less, about 200 Ω/sq or less, about 150 Ω/sq or less, about 100 Ω/sq or less, about 70 Ω/sq or less, about 60 Ω/sq or less, about 50 Ω/sq or less, from about 150 Ω/sq to about 30 Ω/sq, from about 120 Ω/sq to about 30 Ω/sq, from about 100 Ω/sq to about 30 Ω/sq, from about 80 Ω/sq to about 30 Ω/sq, or from about 60 Ω/sq to about 30 Ω/sq, but is not limited thereto.

In another embodiment of the present disclosure, the substrate includes a rigid and/or transparent polymer, or a flexible and/or transparent polymer, or a stretchable and/or transparent polymer, but not limited thereto. For example, the substrate may include a polymer such as silicones, polyimides (PI), polyethersulfons (PES), polyetheretherketones (PEEK), polyethyleneterephthalates (PET), polyethylene naphthalates (PEN), or polycarbonates (PC), but not limited thereto.

In another embodiment of the present disclosure, the electromagnetic wave shielding film is in a form of sheet or roll. However, the present disclosure is not limited thereto.

In another embodiment of the present disclosure, the electromagnetic wave shielding film may be attached to, laminated to or wrap inside or outside the electronic or electric device. For example, the electromagnetic wave shielding film may be attached to, laminated to or wrap at least one inside surface or at least one outside surface of the electronic or electric device after removing the first protective layer so as to attach or laminate the graphene via the adhesive layer to a proper place in area(s) generating electromagnetic waves or area(s) for blocking electromagnetic waves in the electronic or electric device electric device. However, the present disclosure is not limited thereto.

In another embodiment of the present disclosure, the graphene may have a large scale with a horizontal and/or vertical length of from about 1 mm to about 1,000 m. The graphene may have a homogeneous, uniform structure with little deficits. The graphene may include monolayer or multilayer graphene. An electric characteristic of the graphene may vary depending on the thickness of the graphene. Accordingly, the electromagnetic wave shielding effect may vary. As an unlimited example, the thickness of the graphene may be adjusted in a range of from 1 layer to 100 layers. For example, the thickness of the graphene may be adjusted in a range of from 1 layer to 100 layers, from 1 layer to 90 layers, from 1 layer to 80 layers, from 1 layer to 70 layers, from 1 layer to 60 layers, from 1 layer to 50 layers, from 1 layer to 40 layers, from 1 layer to 30 layers, from 1 layer to 20 layers, from 1 layer to 10 layers, from 1 layer to 8 layers, from 1 layer to 6 layers, from 1 layer to 4 layers, or from 1 layer to 2 layers. In another embodiment of the present disclosure, each of the first protective layer and the second protective layer may independently include, but not limited to, polyethylenes (PE), polypropylenes (PP), polyimides (PI), polyethylene terephthalates (PET), polyesters, polyethers, sulfonated polyethylenes, epoxys, phenol resins, polybutylene terephthalates (PBT), polyethylene naphthalates (PEN), polybutylene naphthalates (PBN), and the like.

In another embodiment of the present disclosure, the adhesive layer may include, but not limited to, a thermal release polymer, a low-density polyethylene, a low molecular polymer, a high molecular polymer, or a ultraviolet or infrared ray curable polymer. Specifically, for the adhesive layer, PDMS, various types of poly urethane films, a water system adhesive, which is an environment-friendly adhesive, a water soluble adhesive, a vinyl acetate emulsion adhesive, acrylic adhesives, acrylate adhesives, a hot melt adhesive, a photo-curable (UV, visible light, electron beam, and UV/EB curable) adhesive, a NOA adhesive, and high heat resistance adhesives such as polybenizimidazole (PBI), polyimide (PI), silicone/imide, bismaleimide (BMI), and modified epoxy resin, and the like may be used. Various general, commercial adhesive tapes may also be used. For example, the adhesive layer may include, but not limited to, a high temperature adhesive which is stable as high as 350° C. when the magnetic wave shielding film is used for microwave oven, but the present disclosure is not limited thereto. Such high temperature adhesives may be adhesives based on epoxy, silicones, UV curable polymers, LED curable polymers, polyurethanes, polysulfides, and the like, which may be commercially available. In another embodiment of the present disclosure, the electromagnetic wave shielding film can effectively shield electromagnetic waves generated from various electromagnetic wave generating sources by using graphene uniformly prepared in a large scale and uniformly. More specifically, the present disclosure can shield electromagnetic waves in a broad frequency band of from about 2 GHz to about 18 GHz by using graphene, and furthermore, various substrates coated with graphene. However, the present disclosure is not limited thereto.

Another aspect of the present disclosure provides an electronic or electric device including the electromagnetic wave shielding film according to the above aspect of the present disclosure.

In one embodiment of the present disclosure, the electromagnetic wave shielding film is attached inside or outside the electronic or electric device. However, the present disclosure is not limited thereto. For example, the electromagnetic wave shielding film may attached to, laminated to or wrap at least one inside surface or at least one outside surface of the electronic or electric device, but not limited thereto.

In another embodiment of the present disclosure, the electronic or electric device includes a microwave oven or mobile phone, but not limited thereto.

In another embodiment of the present disclosure, the electronic or electric device includes the electromagnetic wave shielding film which may be attached or laminated inside or outside the electronic or electric device after removing the first protective layer so as to attach or laminate the graphene via the adhesive layer to a proper place area(s) generating electromagnetic waves or area(s) for blocking electromagnetic waves in the electronic or electric device electric device. However, the present disclosure is not limited thereto.

Another aspect of the present disclosure provides a microwave oven, comprising a window including one or more layers of graphene formed between two layers of a transparent substrate. For example, the one or more layers of graphene are sandwiched or laminated between two layers of a transparent substrate, but not limited thereto.

In one embodiment of the present disclosure, the substrate may be glass, quartz, or a polymer substrate including a polymer such as polymethyl methacrylates (PMMA), or polycarbonates (PC), but not limited thereto.

Hereinafter, examples of the present disclosure will be described in detail. However, the present disclosure is not limited to the examples.

EXAMPLES

Example 1

1. Growth of Large Scale Graphene on a Copper Foil

A ~7.5 inch quartz tube was wrapped with a Cu foil (thickness: 25 μm; size: 210×297 mm$^2$; Alfa Aesar Co.) to form a roll of the Cu foil. The quartz tube was inserted into a ~8 inch quartz tube and fixed therein. Thereafter, the quartz tube was heated to 1,000° C. while flowing 10 sccm $H_2$ at 180 mTorr. After the temperature of the quartz tube reaches 1,000° C., annealing was performed for 30 minutes while maintaining the flow of $H_2$ and the pressure. Subsequently, a gas mixture ($CH_4$:$H_2$=30:10 sccm) containing a carbon source was supplied at 1.6 Torr for 15 minutes to grow graphene on the Cu foil. Thereafter, the graphene was cooled to a room temperature at a velocity of ~10° C./s within short time while flowing $H_2$ under a pressure of 180 mTorr so that the graphene grown on the Cu foil was obtained.

2. Transferring Process of Graphene and a Roll-to-Roll Doping Process

Figure 6:
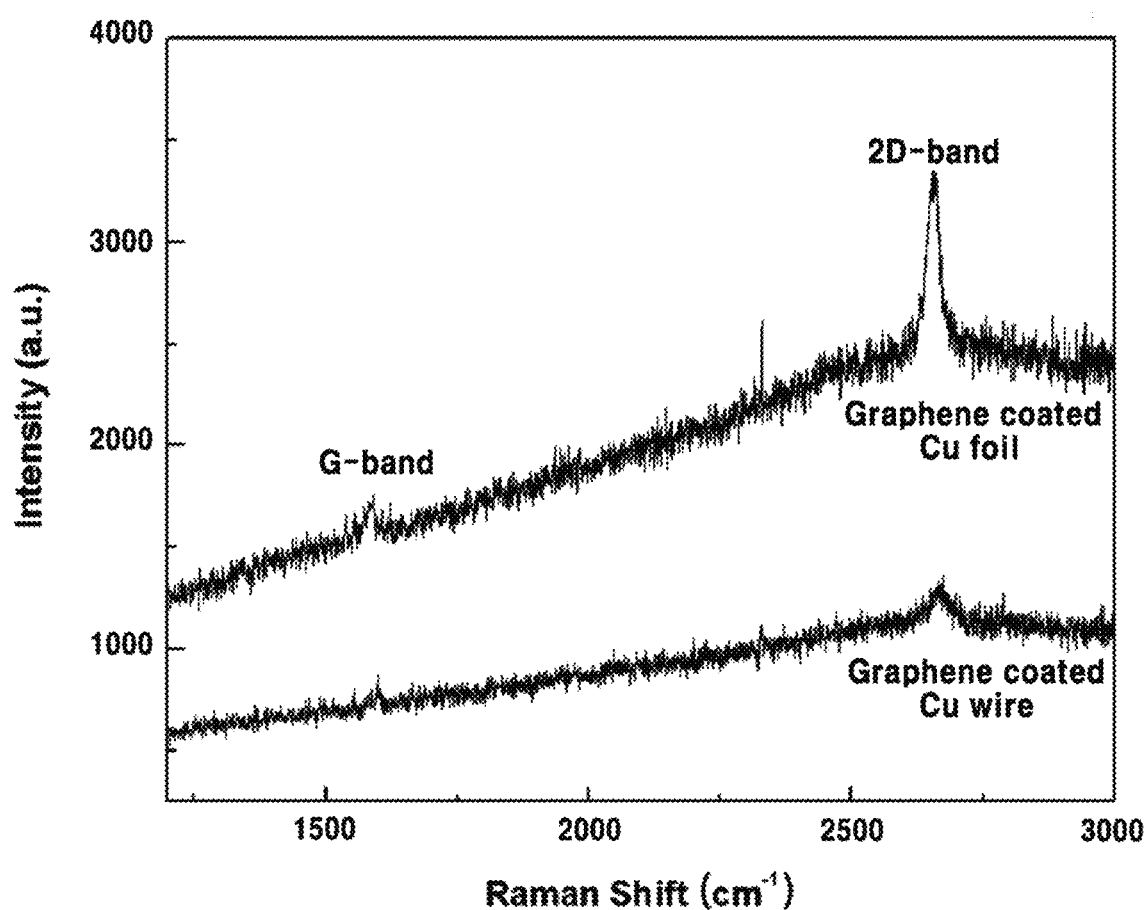
FIG. 6 is a Raman spectroscope analysis result of graphene formed on a metal substrate in accordance with an example of the present disclosure.
Figure 7:
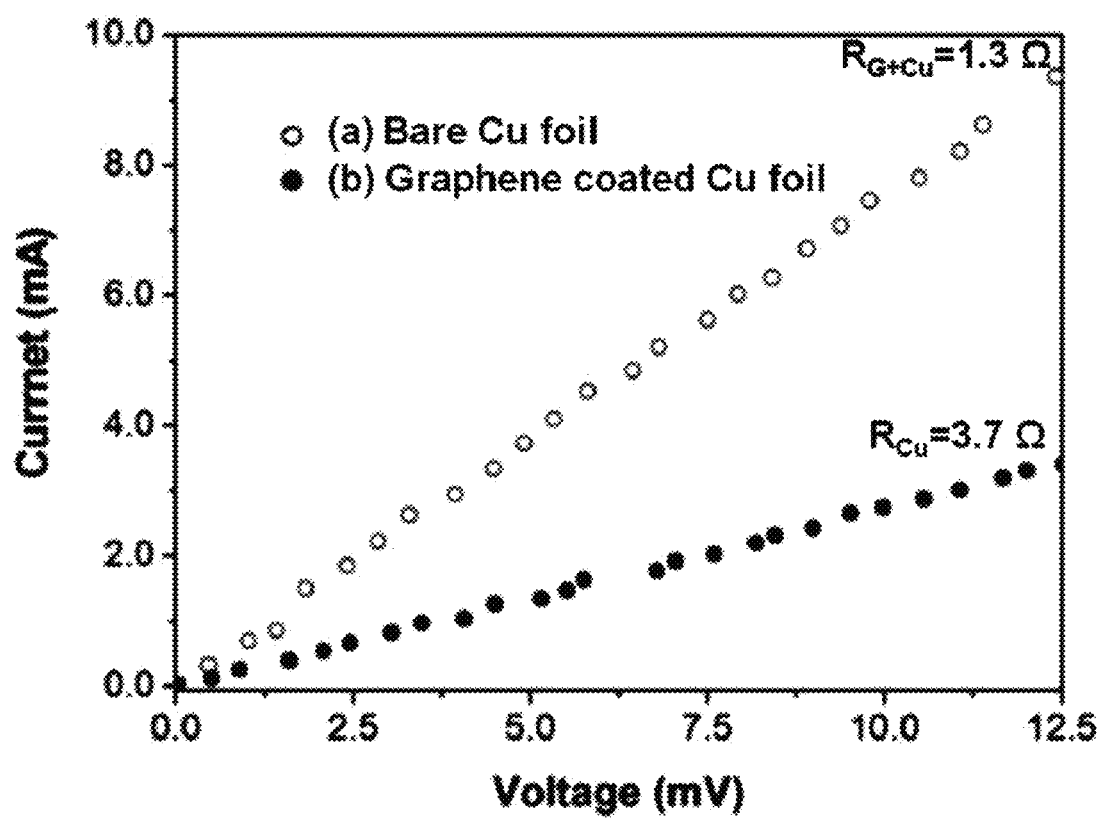
FIG. 7 is a graph showing an electric characteristic depending on whether graphene is formed on a metal substrate or not, in accordance with an example of the present disclosure.

After a thermal release tape (Jin Sung Chemical Co. and Nitto Denko Co.) was contacted with the graphene formed on the Cu foil, the graphene was passed through an adhesion roller including two rollers under the condition that a low pressure of ~2 MPa was applied, to adhere the graphene onto the thermal release tape. Next, the Cu foil/graphene/thermal release tape layered structure was immersed in a 0.5 M $FeCl_3$ or 0.15M $(NH_4)_2S_2O_8$ etching aqueous solution to etch and remove the Cu foil through electrochemical reaction and thus a graphene/thermal release tape layered structure was obtained. Thereafter, the graphene was cleaned with deionized water to remove residing etching components. Next, the graphene transferred onto the thermal release tape was contacted with each of PET, a Cu mesh, and a Cu foil, and thereafter, was passed through a transfer roller in the condition that low heat of 90° C. to 120° C. was applied for from 3 to 5 minutes to separate the graphene from the thermal release tape and transfer the graphene onto each of the PET, the Cu mesh, and the Cu foil. FIG. 6 is a graph based on Raman spectroscope analysis of the graphene. From the graph, it is confirmed that a monolayer graphene has been well grown on each of the substrates. If necessary, multilayer graphene may be transferred onto an identical target substrate by repeating the above-described processes on the identical target substrate. With reference to FIGS. 8A-8D, it is confirmed that tetralayer graphene has been formed on each of the substrates by repeating the above-described processes.

Subsequently, the graphene transferred onto each of the substrates is doped by the roll-to-roll process as shown in FIG. 1. More specifically, $AuCl_3$—$CH_3NO_2$ and $HNO_3$ are used as dopants. The graphene is p-doped by immersing the graphene into the $AuCl_3$—$CH_3NO_2$ solution and the solution including 63 wt % $HNO_3$ for about 5 minutes and passing the graphene through the solutions by using a roll-to-roll transferring apparatus as shown in FIG. 1.

3. Shielding Efficiency Measurement

Figure 9:
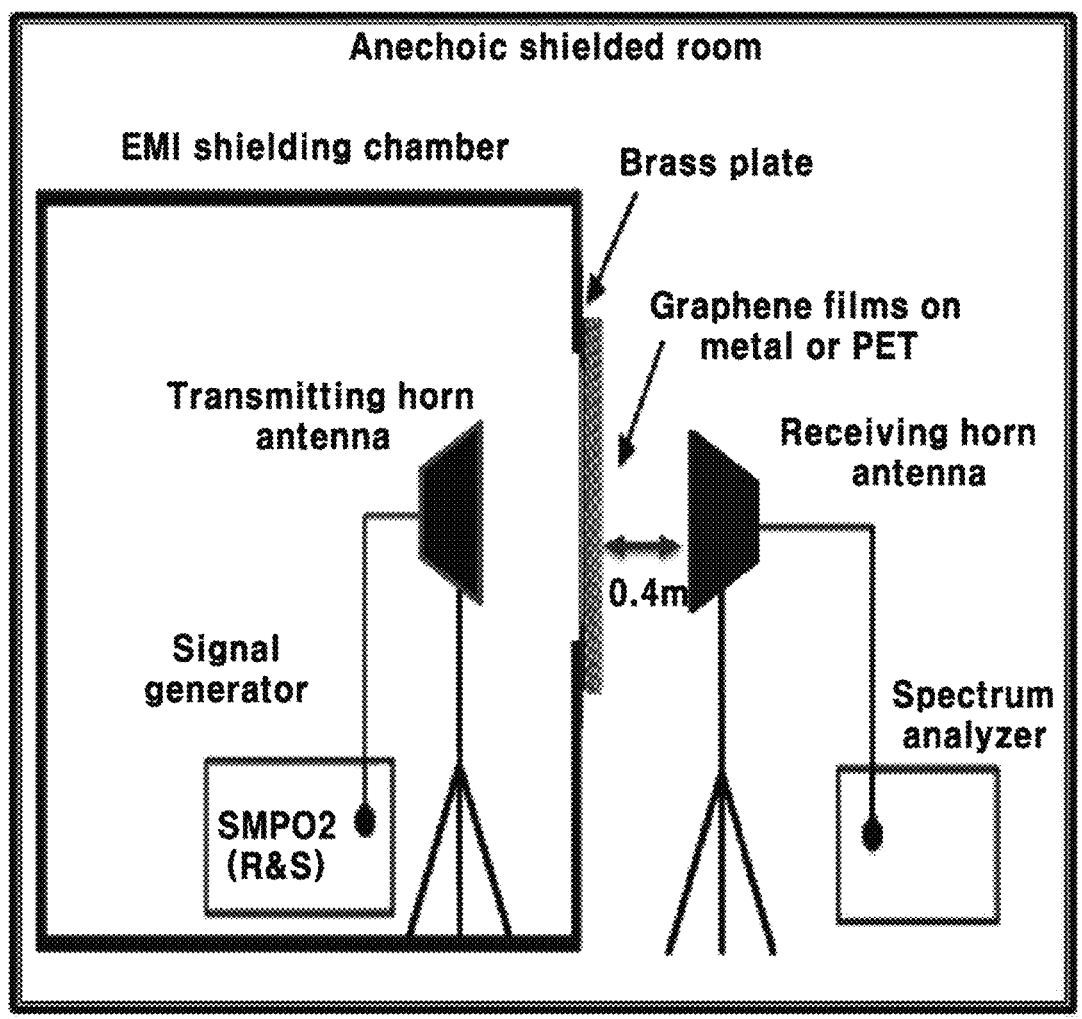
FIG. 9 is a schematic view of an apparatus for measurement of a shielding effect in accordance with an embodiment of the present disclosure.

In order to compare an electromagnetic wave shielding rate depending on whether graphene is provided or not, the shielding efficiency was measured by the electromagnetic wave shielding certificate authority (IST: Intelligent Standard Technology) as follows:

FIG. 9 is a photograph showing an apparatus for measurement of a shielding effect and configuration thereof. More specifically, in the present disclosure, distance between a shielding material and an antenna is maintained 40 cm. For minimization of noise, a shielding box (a mini chamber, 30 cm×25 cm×35 cm) specifically prepared to shield a testing frequency domain to the maximum was used. By generating electromagnetic waves in the shielding box, intensity of the sweeping electromagnetic waves of a general shielding material and a shielding material coated with graphene was measured. For a transmitting horn antenna, a double ridge horn antenna (R&S) is used. For a receiving horn antenna, a double ridge horn antenna (EMCO) was used. For a signal generation device, the SMP02 signal generation device of R&S was used. The device was configured to be inserted into the shielding box and be operated wirelessly therein. For an analysis device, the R3273 spectrum analyzer of ADVANTEST was used. With respect to the frequency domain used for the testing, the high frequency domain of from 2 GHz to 18 GHz was used. Electric field intensity used for each of the frequencies was fixed to 124 dBuV.

The present disclosure has been described in detail with reference to examples. However, it is clear that the present disclosure is not limited to the examples, and may be corrected and modified in various forms by those skilled in the art without departing from the technical concept and the technical area of the present disclosure.

What claimed is:

1. A method for shielding electromagnetic waves by using graphene, the method comprising:
   forming 2 to 4 layers of graphene outside or inside a device having electromagnetic wave generating source to shield electromagnetic waves by the graphene,
   wherein the 2 to 4 layers of graphene are formed on a first side of a substrate,
   wherein an adhesive layer is formed on the graphene,
   wherein a first protective layer is formed on the adhesive layer, the first protective layer forming a first outer layer of an electromagnetic wave shielding film,
   wherein a second protective layer is formed on a second side of the substrate, the second side opposite the first side, wherein the second protective layer forms a second outer layer of the electromagnetic wave shielding film,
   wherein a sheet resistance of the graphene is between 120 Ω/sq to 30 Ω/sq,
   wherein the electromagnetic wave shielding film is configured to shield from an electromagnetic wave with a broad frequency band between 2 GHz to 18 GHz, and,
   wherein the first protective layer and the second protective layer are each independently formed from a material selected from a group consisting of: polyethylenes, polypropylenes, polyimides, polyethylene terephthalates, polyesters, polyethers, sulfonated polyethylenes, epoxys, phenol resins, polybutylene terephthalates, polyethylene naphthalates, and polybutylene naphthalates, and
   wherein the graphene is doped with $AuCl_3$—$CH_3NO$.

2. The method for shielding electromagnetic waves by using graphene of claim 1, wherein the graphene formed outside or inside the device having the electromagnetic wave generating source is produced by a chemical vapor deposition method.

3. The method for shielding electromagnetic waves by using graphene of claim 1, wherein the graphene is formed by transferring or laminating the graphene formed on the substrate by a chemical vapor deposition method to the outside or the inside of the device having the electromagnetic wave generating source.

4. The method for shielding electromagnetic waves by using graphene of claim 3, wherein the substrate includes a rigid and/or transparent substrate, or a flexible and/or transparent substrate, or a stretchable and/or transparent substrate.

5. A method for shielding electromagnetic waves by using graphene, the method comprising:
attaching, laminating or wrapping with a substrate on which 2 to 4 layers of graphene is formed or transferred to or around outside or inside of a device having an electromagnetic wave generating source to shield electromagnetic waves by the graphene,
wherein the 2 to 4 layers of graphene are formed on a first side of the substrate,
wherein an adhesive layer is formed on the graphene,
wherein a first protective layer is formed on the adhesive layer, the first protective layer forming a first outer layer of an electromagnetic wave shielding film,
wherein a second protective layer is formed on a second side of the substrate, the second side opposite the first side, wherein the second protective layer forms a second outer layer of the electromagnetic wave shielding film,
wherein a sheet resistance of the graphene is between 120 Ω/sq to 30 Ω/sq,
wherein the electromagnetic wave shielding film is configured to shield from an electromagnetic wave with a broad frequency band between 2 GHz to 18 GHz, and,
wherein the first protective layer and the second protective layer are each independently formed from a material selected from a group consisting of: polyethylenes, polypropylenes, polyimides, polyethylene terephthalates, polyesters, polyethers, sulfonated polyethylenes, epoxys, phenol resins, polybutylene terephthalates, polyethylene naphthalates, and polybutylene naphthalates, and
wherein the graphene is doped with $AuCl_3$—$CH_3NO$.

6. The method for shielding electromagnetic waves by using graphene of claim 5, wherein the graphene is formed by a chemical vapor deposition method.

7. The method for shielding electromagnetic waves by using graphene of claim 5, wherein the substrate includes a form of a foil, a wire, a plate, a tube, a film, a sheet, a mesh or a net.

8. The method for shielding electromagnetic waves by using graphene of claim 5, wherein the substrate includes a rigid and/or transparent substrate, or a flexible and/or transparent substrate, or a stretchable and/or transparent substrate.

9. An electromagnetic wave shielding film, comprising:
2 to 4 layers of graphene formed on a first side of a substrate;
an adhesive layer formed on the graphene;
a first protective layer formed on the adhesive layer, wherein the first protective layer forms a first outer layer of the electromagnetic wave shielding film; and,
a second protective layer formed on a second side of the substrate, the second side opposite the first side, wherein the second protective layer forms a second outer layer of the electromagnetic wave shielding film,
wherein a sheet resistance of the graphene is between 120 Ω/sq to 30 Ω/sq,
wherein the electromagnetic wave shielding film is configured to shield from an electromagnetic wave with a broad frequency band between 2 GHz to 18 GHz, and,
wherein the first protective layer and the second protective layer are each independently formed from a material selected from a group consisting of: polyethylenes, polypropylenes, polyimides, polyethylene terephthalates, polyesters, polyethers, sulfonated polyethylenes, epoxys, phenol resins, polybutylene terephthalates, polyethylene naphthalates, and polybutylene naphthalates, and
wherein the graphene is doped with $AuCl_3$—$CH_3NO_2$.

10. The electromagnetic wave shielding film of claim 9, wherein the substrate includes a rigid and/or transparent substrate, or a flexible and/or transparent polymer, or a stretchable and/or transparent polymer.

11. The electromagnetic wave shielding film of claim 9, wherein the electromagnetic wave shielding film is in a form of sheet or roll.

12. The electromagnetic wave shielding film of claim 9, wherein the graphene is formed by a chemical vapor deposition method.

13. An electronic or electric device including the electromagnetic wave shielding film of claim 9.

14. The electronic or electric device of claim 13, wherein the electromagnetic wave shielding film is attached inside or outside the electronic or electric device.

15. The electronic or electric device of claim 13, wherein the electronic or electric device includes a microwave oven or mobile phone.

16. A microwave oven, comprising:
a window including the electromagnetic wave shielding film according to claim 9 formed between two layers of a transparent substrate, such that one layer of the transparent substrate is the substrate of the electromagnetic wave shielding film.

17. The microwave oven of claim 16, wherein the transparent substrate is a polymer, glass or quartz.

* * * * *